United States Patent [19]
Hashimoto et al.

[11] Patent Number: 5,721,075
[45] Date of Patent: Feb. 24, 1998

[54] BLANKS FOR HALFTONE PHASE SHIFT PHOTOMASKS, HALFTONE PHASE SHIFT PHOTOMASKS, AND METHODS FOR FABRICATING THEM

[75] Inventors: Keiji Hashimoto; Junji Fujikawa; Hiroshi Mohri; Masahiro Takahashi; Hiroyuki Miyashita; Yukio Iimura, all of Tokyo, Japan

[73] Assignee: Dai Nippon Printing Co., Ltd., Tokyo, Japan

[21] Appl. No.: 783,829

[22] Filed: Jan. 13, 1997

Related U.S. Application Data

[62] Division of Ser. No. 282,465, Aug. 1, 1994, Pat. No. 5,614,335.

[30] Foreign Application Priority Data

Jul. 30, 1993 [JP] Japan .................................. 5-188586

[51] Int. Cl.$^6$ ....................................................... G03F 9/00
[52] U.S. Cl. ................................................ 430/5; 430/320
[58] Field of Search ................................. 430/5, 311, 320

[56] References Cited

U.S. PATENT DOCUMENTS

| | | | |
|---|---|---|---|
| 5,429,896 | 7/1995 | Hasegawa | 430/5 |
| 5,429,897 | 7/1995 | Yoshioka | 430/5 |
| 5,538,816 | 7/1996 | Hashimoto | 430/5 |

*Primary Examiner*—Kathleen Duda
*Attorney, Agent, or Firm*—Sughrue, Mion, Zinn, Macpeak & Seas, PLLC

[57] ABSTRACT

The invention relates a halftone phase shift photomask and a blank therefor, which enables the transmittance of a phase shift portion to be varied even after blank or photomask fabrication, can accommodate to a variety of patterns, and can be fabricated on a mass scale. The exposure light transmittance of a halftone phase shift layer is arbitrarily variable within the range of 1% to 50%, inclusive, by exposing the blank or photomask to a high temperature elevated to at least 150° C., to an oxidizing atmosphere, or to a reducing atmosphere at a step that can provided independent of the steps for film-forming or photomask fabrication step. This enables the exposure light transmittance of the halftone phase shift layer to be changed to any desired value after blank or photomask fabrication, and so an optimal halftone phase shift photomask to be obtained depending on the size, area, location, shape, and the like of the transferred pattern.

10 Claims, 4 Drawing Sheets

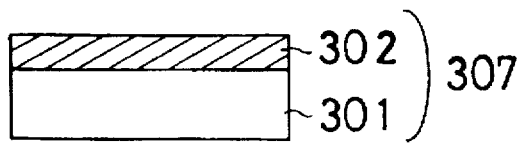
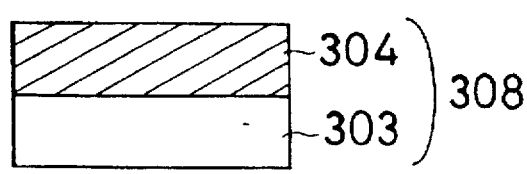
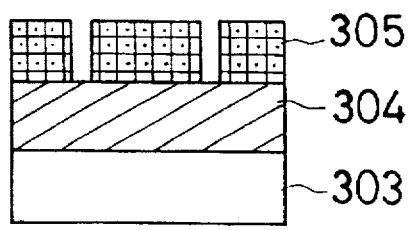
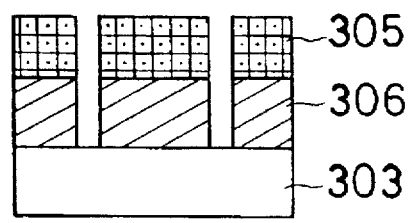
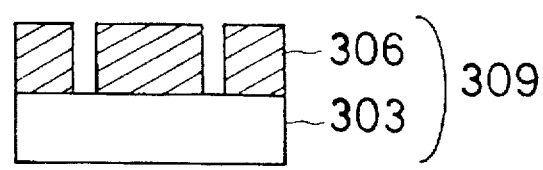
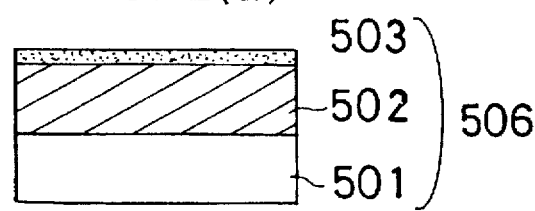
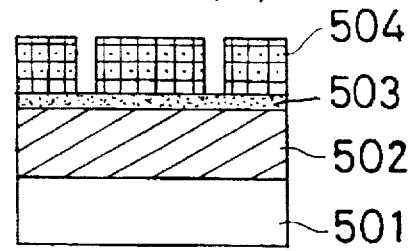
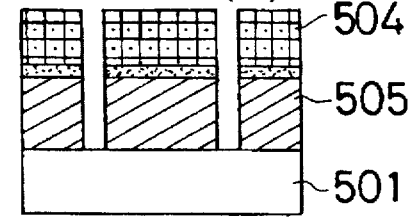
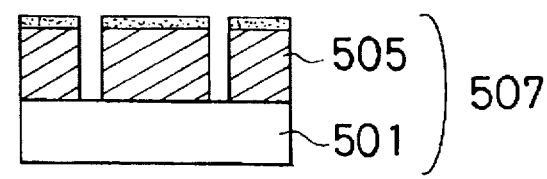

BLANKS FOR HALFTONE PHASE SHIFT PHOTOMASKS, HALFTONE PHASE SHIFT PHOTOMASKS, AND METHODS FOR FABRICATING THEM

This is a divisional of application No. 08/282,465, filed Aug. 1, 1994, U.S. Pat. No. 5,614,335.

BACKGROUND OF THE INVENTION

The present invention relates generally to a photomask used for fabricating high-density integrated circuits such as LSIs and VLSIs and a photomask blank for fabricating such a photomask. The invention relates more particularly to a halftone phase shift photomask that enables a projected image of fine size to be obtained, a halftone phase shift photomask blank for fabricating such a phase shift photomask and methods for fabricating them.

Semiconductor integrated circuits such as ICs, LSIs, and VLSIs are fabricated by the repetition of the so-called lithography process using a photomask. To fabricate integrated circuits of fine size, the use of phase shift photomasks such as those set forth in JP-A 58-173744 and JP-B 62-59296 have been under investigation. Currently available are phase shift photomasks of various structures, among which is the halftone phase shift photomask (such as one set forth in U.S. Pat. No. 4,890,309) that is attracting attention due to its likelihood of being able to be immediately put to practical use. As disclosed in JP-A 5-2259, JP-A 5-127361, or the like, some proposals have been made in terms of construction and material that enable yield to be increased due to a reduction in the number of fabrication steps, and cost to be cut down.

A typical halftone phase shift photomask will be explained briefly with reference to FIGS. 3 and 4. FIG. 3 illustrates the principles of the halftone phase shift lithography, and FIG. 4 represents those of the prior art. FIGS. 3(a) and 4(a) are sectional schematics of photomasks; FIGS. 3(b) and 4(b) show the amplitude of light on photomasks. FIGS. 3(c) and 4(c) illustrate the amplitude of light on wafers; and FIGS. 3(d) and 4(d) depict the intensity of light on wafers. Reference numerals 101 and 201 stand for a substrate; 202 represents a 100% light blocking film; 102 indicates a semi-transparent film that effects a substantially 180° phase shift of incident light and has a transmittance of 1% to 50%; and 103 and 203 represent incident light. In the prior art shown in FIG. 4(a), the 100% light blocking film 202 which, for example, is made up of chromium is merely formed on the substrate 201 which, for example, is made up of quartz glass, thereby defining a light-transmitting portion in a desired pattern. Using this arrangement there is a drop in resolution because the light on the wafer shows a divergent intensity distribution, as can be seen from FIG. 4(d). In the halftone phase shift lithography, on the other hand, the phase of the light passing through the semi-transparent film 102 is substantially inverted with respect to that of the light passing through the opening, so that, as can be seen from FIG. 3(d), the light intensity can be reduced to zero at the pattern boundary on the wafer or can be prevented from having a divergent distribution. Therefore, there is an increase in resolution.

Here, a point worth, of mention is that in phase shift lithography processes of types other than the halftone type, the lithographic step should be repeated at least twice because the pattern of the light blocking film differs from that of the phase shifter film, whereas in the halftone phase shift lithography the lithographic step need not essentially be repeated because there is one pattern. This is a great advantage of the halftone phase shift lithography.

In the halftone phase shift photomask, it is to be noted that the semi-transparent film 102 must serve a two functions, phase inversion and transmittance control. In the phase inversion function, the phase of the exposure light passing through the halftone phase shift portion is substantially inverted with respect to that of the exposure light passing through the opening. Now assume that the halftone phase shift layer 102 can be treated as an absorbing film described in, for instance, M. Born and E. Wolf, "Principles of Optics", pp. 628–632, and so multiple interference can be neglected. Then, the phase change of the vertically transmitted light is found by $$\phi = \sum_{k=1}^{m-1} \chi^{k,k+1} + \sum_{k=2}^{m-1} 2\pi(u_k - 1)d_k/\lambda \qquad (1)$$

When $\phi$ is within the range of $n\pi \pm \pi/3$, where n is an odd number, the phase shift effect is achievable. In Eq. (1), $\phi$ is the phase change of the light transmitting vertically through a photomask having (m−2) layers on a substrate, $\chi^{k,k+1}$ is the phase change taking place on the interface of the kth layer and the (k+1)th layer, $u_k$ and $d_k$ are the refractive index and thickness of the material forming the kth layer, respectively, and $\lambda$ is the wavelength of exposure light, with the proviso that the layer of k=1 is the substrate and the layer of k=m is air.

On the other hand, the exposure light transmittance of the halftone phase shift portion, at which the halftone phase shift effect is achievable, is determined by the size, area, location, configuration, and the like of the transferred pattern, and varies with the pattern. To obtain the effect mentioned above, it is a substantial requirement that the exposure light transmittance of the halftone phase shift portion fall within the range of the optimal transmittance (determined by the pattern) ± a few %. Usually, this optimal transmittance varies largely within a wide range of 1% to 50% depending on the transferred pattern, when the transmittance of the opening is deemed as 100%. In other words, halftone phase shift photomasks having a variety of transmittances are required to accommodate every pattern.

In fact, the phase inversion and transmittance control functions are determined by the complex indices of refraction (refractive index and extinction coefficient), and thicknesses of substrate material and the material forming the halftone phase shift film (each material forming each layer in the case of a multi-layer structure). More exactly, what is used as a halftone phase shift layer of a halftone phase shift photomask is material whose exposure light transmittance comes within the range of 1% to 50%, when it is formed on a substrate such that the phase difference found by Eq. (1) comes within the range given by $n\pi \pm \pi/3$ (n=an odd number). Known materials with these characteristics are compounds such as oxides, nitrides, fluorides, carbides, and chlorides of chromium compounds, as disclosed in JP-A 5-127361. These compounds vary in the above complex index of refraction depending on their composition, texture, structure, and the like. Thus, if the material is formed into a proper film depending on the transmittance demanded, it is then possible to obtain a halftone phase shift photomask having a desired transmittance.

As can be understood from Eq. (1), however, once the material to form a halftone phase shift film is determined, the film thickness needed to have the phase inversion function is determined. In other words, it is impossible to control the transmittance of the halftone phase shift portion by varying the thickness of the halftone phase shift film. To fabricate halftone phase shift photomasks having a variety of exposure light transmittances while maintaining the phase inversion function, it is required to keep a variety of halftone phase shift film materials on hand. Another consideration has been given to a method in which a halftone phase shift film is made up of one layer serving as the phase inversion function, and one layer serving as the transmittance control function. The thickness of the latter is controlled to achieve the transmittance demanded. A serious problem with all these prior methods, however, is that mass fabrication is not easy, because a choice of halftone phase shift film material, the optimization of film thickness, etc., must be made individually depending on a variety of transmittance requirements.

The optimal transmittance is often determined by the simulation of a semiconductor fabrication process using masks on the basis of pattern size, area, location and configuration, and other factors. In most cases, however, it is difficult to find the optimal exposure light transmittance only by use of such simulation, because the semiconductor fabrication process has a multiplicity of parameters. Thus, after the fabrication of a halftone phase shift photomask, there is a need to alter the transmittance of the halftone phase shift portion. However, such an alteration has, up to this point, been impossible, and this is one of the grave problems in associated with halftone phase shift photomask fabrication.

SUMMARY OF THE INVENTION

In view of such problems as mentioned above, an object of the invention is to provide a halftone phase shift photomask blank which enables the exposure light transmittance of a halftone phase shift film to be changed even after blank or photomask fabrication, which can accommodate a variety of patterns and can be mass-fabricated. Other objects of the invention are to further provide a halftone phase shift photomask fabricated from such a blank, and methods for fabricating the mask and blank.

The invention has been accomplished as a result of studies made to develop a halftone phase shift photomask blank which enables the exposure light transmittance of a halftone phase shift film to be changed even after blank or fabrication, can accommodate to a variety of patterns, and can be mass-fabricated.

More specifically, the invention relates to a halftone phase shift photomask blank having a halftone phase shift film on a transparent substrate. The exposure light transmittance of the halftone phase shift film is variable at a step which is independent of the steps of fabricating the blank or forming the blank into a mask. A halftone phase shift photomask is obtained by patterning the halftone phase shift film of the blank. The step of changing the exposure light transmittance may be carried out before, during or after the obtained blank is formed into a mask.

By way of example, reference will now be made to the step of varying the exposure light transmittance of the aforesaid chromium compound. As previously mentioned, the phase change of exposure light caused by a chromium compound film and the exposure light transmittance of the film are determined not only by film thickness but the refractive index and extinction coefficient of the material forming the film as well. Here, the refractive index and extinction coefficient are determined by the composition, texture, and structure of the film. However, it is to be understood that the refractive index is substantially determined at the time of film formation, and remains nearly unchanged after that, whereas the extinction coefficient often changes largely by changes in the composition, texture and structure of the film. Therefore, since the phase change and transmittance are primarily dependent on the refractive index and extinction coefficient, respectively, it is possible to vary the exposure light transmittance by varying the composition, texture, and structure of the film yet without changing the amount of the phase change largely. The inventors have now found that the exposure light transmittance of a halftone phase shift photomask having a halftone phase shift layer composed mainly of a chromium compound and a blank therefor can be varied by the steps of exposing them to a high temperature exceeding 150° C., to an oxidizing atmosphere, and to a reducing atmosphere without causing any substantial damage to the phase inversion function.

The high-temperature treatment step at a high temperature of 150° C. or higher is provided to heat the halftone phase shift photomask or the blank therefor in air, oxygen or other atmosphere or in a vacuum. Although not fully understood, it is believed that the exposure light transmittance of the film varies by changes in the composition, texture, structure, and other features of the film. For example, the changes may be brought about by reason of the incorporation of a part of the components of the atmospheric gas into the film, the liberation of a part of the film composition, changes in the textural and crystal structures of the film, changes in the layer structure forming the film, etc. When the high-temperature treatment was carried out at a temperature exceeding 150° C., sufficient effects were obtained. Also, since the amount of change in the exposure light transmittance varies depending on heating temperature, heating time, heating atmosphere, etc., it is possible to control the exposure light transmittance by controlling these factors. For this high-temperature treatment use may be made of every heating means including baking furnaces, ovens, and hot plates.

The exposure-to-oxidizing-atmosphere step is provided to expose the halftone phase shift photomask or the blank therefor to an atmosphere composed of oxygen, air, steam, or their mixture, with or without the simultaneous application of heat. The oxidizing atmosphere may be a plasma of the gases mentioned above. Again, since the halftone phase shift film varies in terms of composition, texture, structure, and the like, the exposure light transmittance varies. Moreover, the amount of change in the exposure light transmittance may be controlled by the type of the atmosphere, pressure or other treating conditions, and treating time.

The exposure-to-reducing-atmosphere step is provided to expose the halftone phase shift photomask or the blank therefor to a hydrogen or other atmosphere, with or without the simultaneous application of heat. The reducing atmosphere may be a plasma of the gases mentioned above. Again, since the halftone phase shift film varies in terms of composition, texture, structure, and the like, the exposure light transmittance varies. Moreover, the amount of change in the exposure light transmittance may be controlled by the type of the atmosphere, pressure or other treating conditions, and treating time.

Other processing steps, if available, may be used, with the provisos that they are performed independent of conventional steps for fabricating halftone phase shift photomask blanks, can be carried out in the course of processing the masks or after the completion of mask fabrication, and the processing enables the composition, texture, and structure of halftone phase shift films to be varied. It is understood that the above explanation with reference to a halftone phase shift film composed mainly of chromium is but one example. For instance, the invention may be equivalently applicable to halftone phase shift films composed of compounds of one or two or more elements selected from lithium, magnesium, aluminum, silicon, calcium, scandium, titanium, vanadium, selenium, yttrium, zirconium, molybdenum, indium, tin, antimony, tellurium, barium, lanthanum, cerium, thulium, hafnium, tantalum, tungsten and lead with other elements.

The present invention relates to a halftone phase shift photomask blank including a halftone phase shift layer on a transparent substrate, characterized in that the transmittance of said halftone phase shift layer with respect to exposure light is variable within the range of 1% to 50%, inclusive, and is varied by a step independent of the step of forming said halftone phase shift layer, with the proviso that the transmittance of said transparent substrate is deemed to be 100%.

Preferably, the independent step mentioned above includes a step of exposing said blank to an atmosphere at a temperature exceeding 150° C., to an oxidizing atmosphere, or to a reducing atmosphere. It is here noted that the halftone phase shift layer may be composed mainly of a chromium compound.

The present invention also encompasses a halftone phase shift photomask fabricated by patterning the halftone phase shift layer of such a blank.

According to another aspect of the invention, there is provided a halftone phase shift photomask having a halftone phase shift layer on a transparent substrate, characterized in that the transmittance of said halftone phase shift layer with respect to exposure light is variable within the range of 1% to 50%, inclusive, by a step independent from the fabrication step thereof, with the proviso that the transmittance of an opening in said transparent substrate is deemed as 100%.

Again, it is preferable that the independent step mentioned above includes a step of exposing said photomask to an atmosphere at a temperature exceeding 150° C., to an oxidizing atmosphere, or to a reducing atmosphere. It is here noted that the halftone phase shift layer may be composed mainly of a chromium compound.

It is noted that the independent step mentioned above may be carried out after the completion of the patterning of the halftone phase shift layer.

According to still another aspect of the invention, there is provided a method for fabricating a halftone phase shift photomask blank wherein a halftone phase shift layer is prefabricated with a specific transmittance with respect to exposure light with the proviso that the transmittance of a transparent substrate is deemed as 100%, and the specific transmittance of the halftone phase shift layer is then changed to a given value.

According to yet another aspect of the invention, there is provided a method for fabricating a halftone phase shift photomask, wherein the transmittance of the halftone phase shift portion with respect to exposure light is changed to a given value before, during or after forming the blank into a mask, with the proviso that the transmittance of the opening is deemed as 100%.

According to the invention, the exposure light transmittance of the halftone phase shift layer is arbitrarily variable within the range of 1% to 50% inclusive at a step that is provided independently of the film-forming or photomask fabrication step. Thus, the exposure light transmittance of the halftone phase shift layer can be regulated to any desired value after blank or photomask fabrication. It is possible to obtain an optimal halftone phase shift photomask depending on the size, area, location, shape, and the like of the transferred pattern. This makes a breakthrough in the art.

Still other objects and advantages of the invention will be obvious and apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIGS. 1(a)–1(e) illustrates the process of fabricating a single-layer halftone phase shift photomask according to Example 1 of the invention, FIGS. 2(a)–2(d) illustrates the process of fabricating a multi-layer halftone phase shift photomask according to Example 2 of the invention.

DESCRIPTION OF THE PREFERRED EMBODIMENTS

Figure 3A:
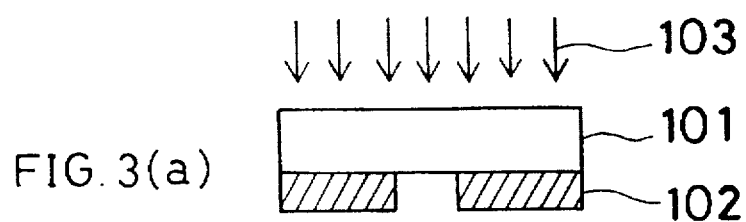
FIGS. 3(a)–3(d) illustrates the principles of halftone phase shift lithography.
Figure 3B:
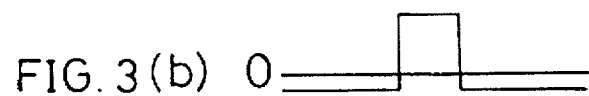
Figure 3C:
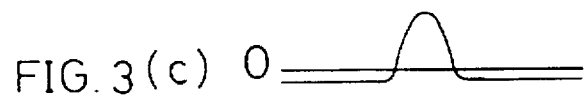
Figure 3D:
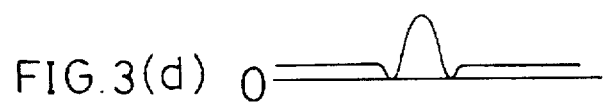
Figure 4A:
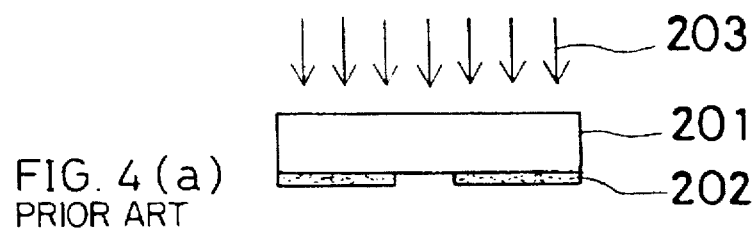
FIGS. 4(a)–4(d) illustrates a conventional method.
Figure 4B:
Figure 4C:
Figure 4D:

The inventive halftone phase shift photomask blank, halftone phase shift photomask, and methods for fabricating them will now be explained more illustratively with reference to some examples.

EXAMPLE 1

One process of fabricating a halftone phase shift photomask with a variable exposure light transmittance is explained with reference to FIG. 1. As shown FIG. 1(a), a chromium compound film 302 was formed at a thickness of about 50 nm on a mirror-polished silicon wafer 301 by sputtering under the following conditions, thereby obtaining a sample 307 for polarization analysis.

Film-forming device: Planar DC magnetron sputtering device

Target: Metallic chromium

Gases: Carbon dioxide gas at a flow rate of 80 sccm plus nitrogen gas at a flow rate of 20 sccm Sputtering pressure: 3 milli-Torr Sputtering current: 6 amperes By measurement at a mercury lamp i-line wavelength (365 nm) with a commercially available spectral ellipsometer (ES-4G made by Sopura Corp.), this sample 307 was found to have a refractive index u of 2.581 and an extinction coefficient k of 0.442, respectively. Now consider the case where this sample in a film form is formed on high-purity synthetic quartz used as a photomask substrate with the proviso that it can be treated as a metal film described in M. Born and E. Wolf, "Principles of Optics", pp. 628–632. The film thickness needed for a 180° phase shift of transmitted light of 365 nm wavelength is then calculated to be 117 nm.

Then, as shown in FIG. 1(b), the chromium compound film 304 was formed at a thickness of about 120 nm on an optically polished and well washed quartz substrate 303 under the conditions mentioned above, thereby obtaining a halftone phase shift photomask blank having a 365-nm wavelength light transmittance of roughly 13%.

Subsequently, a given organic resist pattern 305 was formed on the thus obtained blank 308 by conventional electron beam lithography or photolithography, as shown in FIG. 1(c). As shown in FIG. 1(d), a semi-transparent film 304 under the openings in the resist pattern 305 was then selectively dry-etched by exposure to a radio-frequency plasma at a pressure of 0.3 Torr in a mixed gas atmosphere of $CH_2Cl_2:O_2=1:2.5$, thereby obtaining a desired semi-transparent film pattern 306. Eventually, the remaining resist was stripped off in a conventional manner to obtain such a halftone phase shift photomask 309 as shown in FIG. 1(e), which had a 365-nm wavelength light transmittance of 13%.

Figure 5:
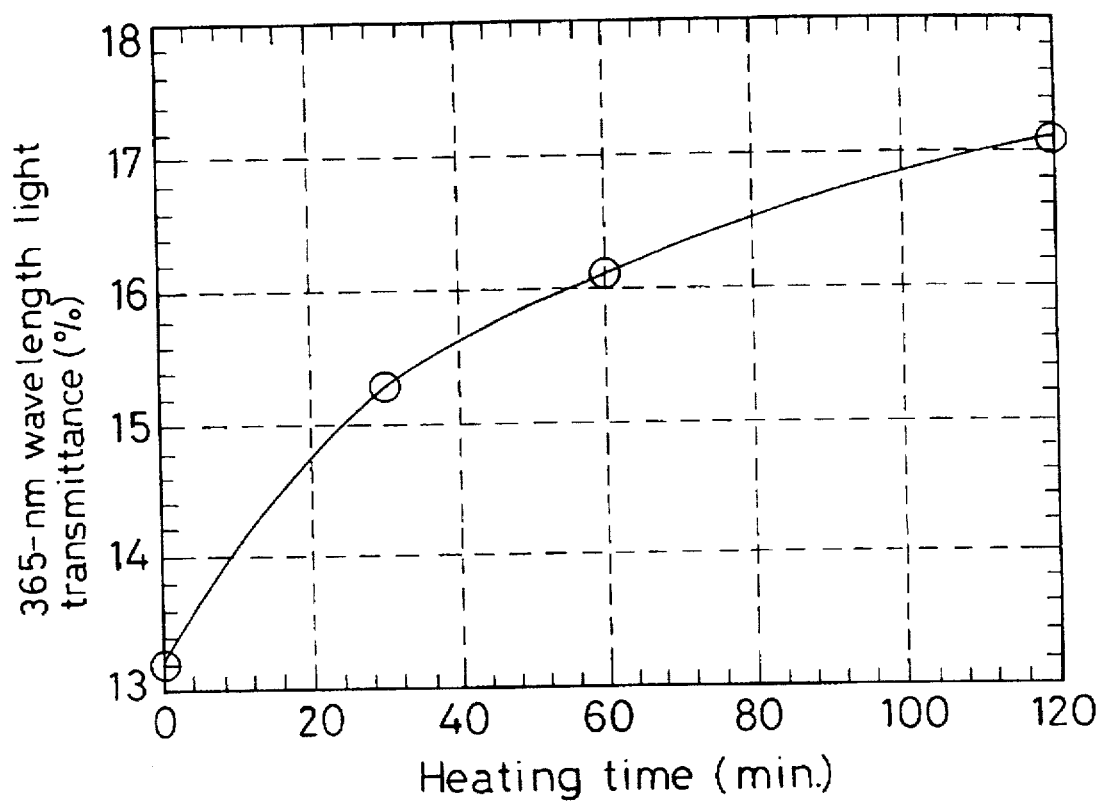
FIG. 5 illustrates the relation between the heating time and transmittance change of the halftone phase shift portion according to Example 1.

This halftone phase shift photomask 309 was heated to 200° C. in an oven with an air atmosphere convected, during which the 365-nm wavelength light transmittance of the halftone phase shift portion changed with heating time, as shown in FIG. 5.

No matter how the transmittance changed, this halftone phase shift photomask 309 was found to conform practical requirements in terms of the dimensional accuracy, sectional shape, thickness distribution and transmittance distribution of the portion from which the semi-transparent film 304 was removed, the adhesion of the film to the substrate, and the like.

EXAMPLE 2

Another process of fabricating a halftone phase shift photomask with a variable exposure light transmittance is explained with reference to FIG. 2. Following the procedure of Ex. 1, a sample for polarization analysis was prefabricated. The refractive index and extinction coefficient of this sample were then measured to find the film thickness needed for a 180° phase shift of 365-nm wavelength light. As shown in FIG. 2(a), a chromium compound film 502 was formed at the calculated thickness on a synthetic quartz substrate 501 under the following conditions, whereby a 365-nm wavelength light transmittance of about 20% was obtained.

Film-forming device: Planar DC magnetton sputtering device

Target: Metallic chromium

Gases: Carbon dioxide gas at a flow rate of 20 sccm plus nitrogen gas at a flow rate of 80 sccm Sputtering pressure: 3 milli-Torr Sputtering current: 6 amperes Then, a metallic chromium film 503 was formed at a thickness of about 10 nm on the thus obtained chromium compound film 502, thereby obtaining a multi-layer halftone phase shift photomask blank 506 having a 365-nm wavelength light transmittance of about 12%.

Film-forming device: Planar DC magnetron sputtering device

Target: Metallic chromium

Gas: Argon gas at a flow rate of 100 sccm

Sputtering pressure: 3 milli-Torr

Sputtering current: 6 amperes

Subsequently, a desired resist pattern 504 composed mainly of an organic substance was formed on the obtained blank 506 by conventional electron beam lithography or photolithography, as shown in FIG. 2(b). As shown in FIG. 2(c), a semi-transparent film under the openings in the resist pattern 504 was then dry-etched by exposure to a radio-frequency plasma at a pressure of 0.3 Torr in a mixed gas atmosphere of $CH_2Cl_2:O_2=1:2.5$, thereby obtaining a desired semi-transparent film pattern 505. Eventually, the remaining resist was stripped off in a conventional manner to obtain such a halftone phase shift photomask 507 as shown in FIG. 2(d).

The layer 502 composed mainly of a chromium compound and the metallic chromium film 503, because both their matrixes are made up of chromium atoms, show almost identical etching properties; the processability of the multilayer halftone phase shift photomask 507 is almost identical with that of single-layer halftone phase shift photomask such as the one obtained in Ex. 1.

Upon the multi-layer halftone phase shift photomask's being exposed to an oxygen plasma for 10 minutes under the following conditions, the 365-nm wavelength light transmittance of the halftone phase shift portion changed from about 12% to about 17%.

Exposure to plasma: Parallel plate radio-frequency plasma

Gas: Oxygen gas at a flow rate of 100 sccm

Pressure: 10 milli-Torr

High-frequency power: 100 watts

The multi-layer halftone phase shift photomask 507 was also found to conform to all practical requirements in terms of dimensional accuracy, sectional shape, thickness distribution, the adhesion of the film to the substrate, etc., both before and after the transmittance change.

EXAMPLE 3

In this example, use was made of the halftone phase shift photomask obtained in Ex. 1, which included a halftone phase shift portion having a 365-nm wavelength light transmittance of about 13%. Upon the photomask being exposed to a hydrogen plasma for 30 minutes under the following conditions, the 365-nm wavelength light transmittance changed from about 13% to about 5%.

Exposure to plasma: Parallel plate radio-frequency plasma

Gas: Oxygen gas at a flow rate of 100 sccm

Pressure: 15 milli-Torr

High-frequency power: 150 watts

This multi-layer halftone phase shift photomask was also found to conform to all practical requirements in terms of dimensional accuracy, sectional shape, thickness distribution, the adhesion of the film to the substrate, etc., both before and after the transmittance change.

EXAMPLE 4

In this example, the inventive halftone phase shift photomask blank for exposure light of deep-ultraviolet wavelength (of approximately 250 nm) and halftone phase shift photomask will be explained.

A chromium compound film was formed on a silicon wafer under the film-forming conditions referred to in Ex. 1. By measurement with a polarization analysis method (using a spectral ellipsometer, ES-4G made by Sopura Corp.), this chromium compound film was found to have a refractive index u of 2.923 and an extinction coefficient k of 0.806. By calculation, the film thickness needed for a 180° phase shift of transmitted light of 250 nm wavelength was found to be 66.6 nm. However, when this chromium compound was formed in an about 66-nm film on a synthetic quartz substrate for photomasks, it had a 250-nm wavelength light transmittance of up to 4%, which was too low for a halftone phase shift film.

Upon the chromium compound film being calcined for 60 minutes in a calcination furnace containing an air atmosphere and maintained at 450° C., the refractive index u and extinction coefficient k were reduced to 2.445 and 0.455, respectively. When the thus calcined film was formed on a synthetic quartz substrate at the thickness of 87 nm needed for phase inversion of light of 250 nm wavelength, it had a transmittance increased to about 8%. In this form, it could be well used as a halftone phase shift film.

Figure 6:
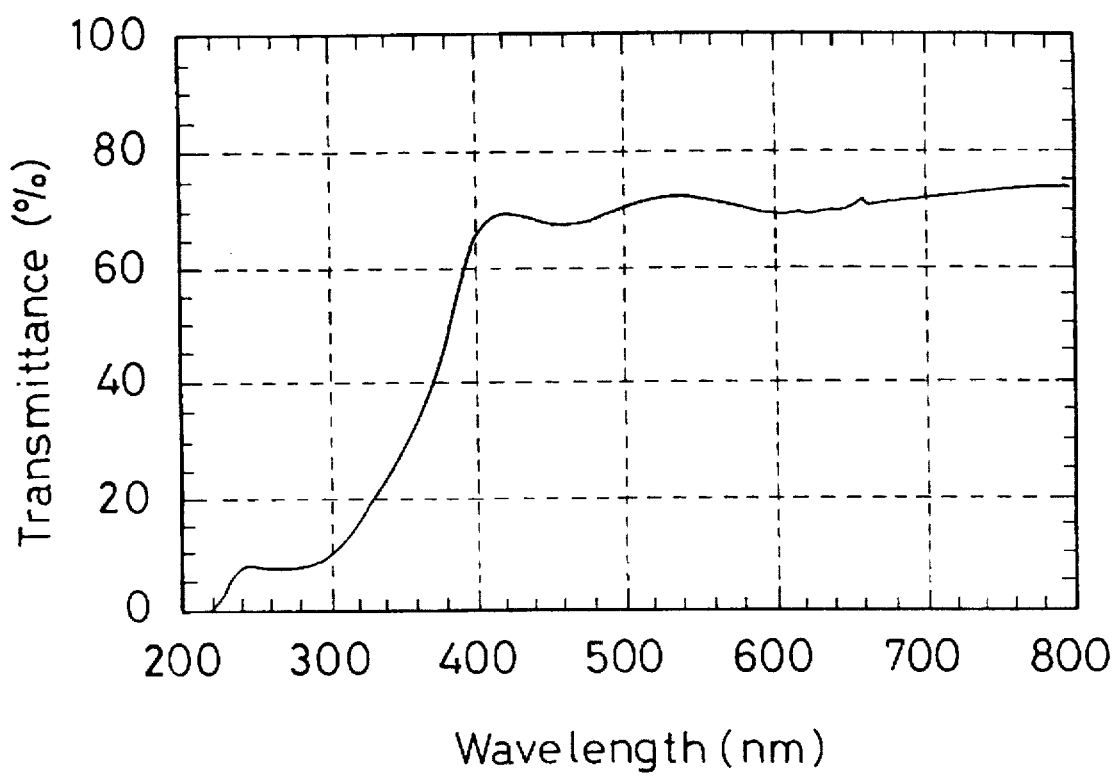
FIG. 6 illustrates a spectral transmittance curve of the halftone phase shift photomask blank according to Example 4.

Based on the findings mentioned above, a chromium compound was formed in film approximately 90 nm thick on a synthetic quartz substrate under the film-forming conditions referred to in Ex. 1, and then calcined in an air atmosphere at 450° C. for 60 minutes, thereby obtaining a blank for a halftone phase shift photomask for exposure to far-ultraviolet wavelength. A spectral transmittance curve of this blank is presented in FIG. 6. This blank shows a transmittance of about 8% in the vicinity of 250 nm; in other words, it can be well used as a halftone phase shift film.

By way of example, a synthetic quartz substrate of 5 inches square and 0.09 inches thickness was observed for warpage change before and after the calcination step, using a flatness meter using interference of helium neon laser light. As a result, it was found that interference fringes did not move before and after the calcination step. In other words, film stress due to the heating step was on a practical level.

It is noted that this blank can be easily processed into a halftone phase shift photomask by such a patterning step as referred to in Ex. 1. The obtained photomask was found to conform to all practical requirements in terms of sectional shape, thickness distribution, transmittance distribution, phase difference distribution, and the like. Also, this photomask was found to be similar in pattern position coordinates accuracy to a photomask obtained without any calcination step.

As can be appreciated from the foregoing description, the invention enables the exposure light transmittance of a halftone phase shift photomask to be arbitrarily varied within the range of 1% to 50%, inclusive, at a step provided independently of the film-forming step or the photomask fabrication step, so that the exposure light transmittance can be regulated to any desired value after blank or photomask fabrication. This enables an optimal halftone phase shift photomask to be obtained depending on the size, are, location, shape, and the like of the transferred pattern, and so is very convenient for blank and photomask fabrication.

What we claim is:

1. A method of fabricating halftone phase shift photomask blank having a halftone phase shift layer on a substrate deemed to have 100% transmittance, the transmittance of said halftone phase shift layer being variable within the range of 1% to 50%, inclusive, said method comprising:

forming a material for said phase shift layer such that its transmittance with respect to exposure light has a specific value forming said phase shift photomask blank using the formed material; and changing the transmittance of the material for the halftone phase shift layer to a desired transmittance value.

2. The method of claim 1, wherein said changing step includes exposing said halftone phase shift material to a temperature of at least 150° C. and less than 450° C.

3. The method of claim 1, wherein said changing step includes exposing said halftone phase shift material to an oxidizing atmosphere.

4. The method of claim 1, wherein said changing step includes exposing said halftone phase shift material to a reducing atmosphere.

5. The method of claim 1, wherein in said forming step, said halftone phase shift material is composed mainly of a chromium compound.

6. A method of fabricating the halftone phase shift photomask having a halftone phase shift portion on a substrate deemed to have 100% transmittance, the transmittance of said halftone phase shift portion being variable within the range 1%–50%, inclusive, said method comprising:

forming a material for said phase shift portion;

forming a photomask blank including said formed material;

forming a photomask from said photomask blank; and changing the transmittance of the material for the halftone phase shift portion to a desired transmittance, wherein said changing step can be performed before, after, or concurrent with said step for forming a photo mask from the photomask blank.

7. The method of claim 6, wherein said changing step includes exposing said halftone phase shift material to a temperature of at least 150° C. and less than 450° C.

8. The method of claim 6, wherein said changing step includes exposing said halftone phase shift material to an oxidizing atmosphere.

9. The method of claim 6, wherein said changing step includes exposing said halftone phase shift material to a reducing atmosphere.

10. The method of claim 6, wherein in said forming step, said halftone phase shift material is composed mainly of a chromium compound.

* * * * *